(12) United States Patent
Bores et al.

(10) Patent No.: US 7,886,910 B2
(45) Date of Patent: Feb. 15, 2011

(54) FRONT OPENING WAFER CARRIER WITH PATH TO GROUND EFFECTUATED BY DOOR

(75) Inventors: Gregory Bores, Prior Lake, MN (US); Suraj Kalia, Eden Prairie, MN (US); Anthony Mathius Tieben, Jordan, MN (US)

(73) Assignee: Entegris, Inc., Billerica, MA (US)

( * ) Notice: Subject to any disclaimer, the term of this patent is extended or adjusted under 35 U.S.C. 154(b) by 1710 days.

(21) Appl. No.: 10/496,756

(22) PCT Filed: Nov. 26, 2002

(86) PCT No.: PCT/US02/37926

§ 371 (c)(1),
(2), (4) Date: Apr. 11, 2005

(87) PCT Pub. No.: WO03/045820

PCT Pub. Date: Jun. 5, 2003

(65) Prior Publication Data

US 2005/0224391 A1    Oct. 13, 2005

Related U.S. Application Data

(60) Provisional application No. 60/333,682, filed on Nov. 27, 2001.

(51) Int. Cl.
*B65D 85/00* (2006.01)
(52) U.S. Cl. ..................... 206/710
(58) Field of Classification Search ............. 336/90–92; 206/710–711
See application file for complete search history.

(56) References Cited

U.S. PATENT DOCUMENTS

| 4,043,451 A | 8/1977 | Johnson |
| 4,450,960 A | 5/1984 | Johnson |
| 4,520,925 A | 6/1985 | Johnson |
| 4,557,382 A | 12/1985 | Johnson |
| 4,593,339 A | 6/1986 | Robinson |
| 4,721,207 A | 1/1988 | Kikuchi |
| 4,739,882 A | 4/1988 | Parikh et al. |
| 4,747,488 A | 5/1988 | Kikuchi |
| 4,817,079 A | 3/1989 | Covington |
| 4,855,845 A | 8/1989 | Thrush |
| 4,983,548 A | 1/1991 | Uno et al. |
| 5,240,753 A | 8/1993 | Tabuchi et al. |
| 5,253,755 A | 10/1993 | Maenke |
| 5,255,797 A | 10/1993 | Kos |
| 5,390,811 A | 2/1995 | Ogino et al. |
| 5,399,398 A | 3/1995 | Toshimitsu et al. |

(Continued)

FOREIGN PATENT DOCUMENTS

JP    57-113446    7/1982

(Continued)

*Primary Examiner*—Tuyen Nguyen
(74) *Attorney, Agent, or Firm*—Patterson Thuente Christensen Pedersen P.A.

(57) ABSTRACT

A front opening wafer carrier formed principally of plastic and comprising an enclosure portion (20) and a door (24) has a path to ground with respect to the wafers (22), the path to ground effectuated by the door (24). The base "ground" may be provided at the machine interface upon which the carrier sits, or through the robotic arm that grasps, operates and moves the door (24).

17 Claims, 4 Drawing Sheets

U.S. PATENT DOCUMENTS

| | | | |
|---|---|---|---|
| 5,472,086 A | 12/1995 | Holliday et al. | |
| 5,476,176 A | 12/1995 | Gregerson et al. | |
| 5,482,161 A | 1/1996 | Williams et al. | |
| 5,555,981 A | 9/1996 | Gregerson | |
| 5,584,401 A | 12/1996 | Yoshida | |
| 5,711,427 A | 1/1998 | Nyseth | |
| 5,755,332 A | 5/1998 | Holliday et al. | |
| 5,782,362 A | 7/1998 | Ohori | |
| 5,785,186 A | 7/1998 | Babbs et al. | |
| 5,788,082 A * | 8/1998 | Nyseth | 206/711 |
| 5,915,562 A * | 6/1999 | Nyseth et al. | 206/710 |
| 5,944,194 A | 8/1999 | Gregerson et al. | |
| 5,982,182 A | 11/1999 | Chiu et al. | |
| 6,003,674 A | 12/1999 | Brooks | |
| 6,082,540 A | 7/2000 | Krampotich et al. | |
| 6,104,202 A | 8/2000 | Slocum et al. | |
| 6,382,419 B1 | 5/2002 | Fujimori et al. | |
| 6,736,268 B2 * | 5/2004 | Nyseth et al. | 206/711 |
| 6,776,289 B1 | 8/2004 | Nyseth | |
| 6,848,578 B2 * | 2/2005 | Eggum | 206/454 |
| 2002/0125170 A1 * | 9/2002 | Nyseth et al. | 206/711 |

FOREIGN PATENT DOCUMENTS

| | | |
|---|---|---|
| JP | 60-173826 | 9/1985 |
| JP | 62-87443 | 6/1987 |
| JP | 62-99575 | 6/1987 |
| JP | 64-37047 | 8/1987 |
| JP | 64-013717 | 1/1989 |
| JP | 05-218185 | 8/1993 |
| JP | 05-254582 | 10/1993 |
| JP | 62-83486 | 10/1994 |
| JP | 10-070185 | 3/1998 |
| JP | 11-204629 | 7/1999 |
| JP | 2000-306988 | 11/2000 |
| WO | WO 95/24348 | 9/1995 |

* cited by examiner

FRONT OPENING WAFER CARRIER WITH PATH TO GROUND EFFECTUATED BY DOOR

This application claims the benefit of U.S. Provisional Application Ser. No. 60/333,682 filed Nov. 27, 2001, the same being incorporated herein by reference.

BACKGROUND OF THE INVENTION

This invention relates to wafer carriers, more particularly it relates to front opening wafer carriers with separable doors.

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. During processing of semiconductor wafers or magnetic disks, the presence or generation of particulates presents very significant contamination problems. Contamination is accepted as the single largest cause of yield loss in the semiconductor industry. As the size of integrated circuitry has continued to be reduced, the size of particles which can contaminate an integrated circuit has also become smaller, making minimization of contaminants all the more critical.

Wafer Carriers configured as enclosures for holding wafers intermediate processing steps are typically formed of numerous plastic components assembled together. The industry accepted configuration for larger wafers, that is 300 mm wafers, is to have an enclosure portion with a lower machine interface configured as a kinematic coupling, an open front closeable by a door, and stacked wafer shelves on the inside sides of the enclosure portion. A door with a pair of latching mechanisms sealingly closes the open front and will typically have wafer restraints that contact and restrain the forward edge of the wafers in the enclosure.

Conventional carriers used in the semiconductor industry may develop and retain static charges. Static buildup on carriers can cause semiconductor processing equipment to automatically shut down. It is desirable to have a carrier with static dissipation characteristics to control static charges.

A undesirable effect of static charges is exhibited when a charged plastic part comes into contact with an electronic device or processing equipment of a significant different potential it may discharge in a damaging phenomena known as electrostatic discharge (ESD). These discharges can be catastrophic during the processing of wafers into semiconductors. Means are known to provide grounding of wafers for minimizing the occurrence of such discharges. See for example U.S. Pat. No. 5,711,082 to Nyseth, owned by the owner of the instant invention.

Contaminants in the form of particles may be generated by abrasion such as the rubbing or scraping of the carrier with the wafers or disks, with the carrier covers or enclosures, with storage racks, with other carriers, or with the processing equipment. It is critical to keep contaminants off of the wafers. The polycarbonate plastic shell of wafer carrier enclosures are known to naturally have a slightly negative charge. Grounding of the wafer shelves and thus the wafers within the enclosure can render the wafers with no electric charge causing particles to be attracted to the plastic enclosure rather than the wafers. See U.S. Pat. No. 5,944,194 to Gregerson, Gallagher, and Wiseman, owned by the owner of the instant invention. The U.S. Pat. No. 5,711,082 and 5,944,194 patents are incorporated herein by reference. These references provide background information, as well as the configuration and construction of wafer carriers, and illustrate means of conventionally providing paths to ground.

SUMMARY OF THE INVENTION

A front opening wafer carrier formed principally of plastic and comprising an enclosure portion and a door has a path-to-ground with respect to the wafers effectuated by the door. The base "ground" may be provided at the machine interface upon which the carrier sits, or through the robotic arm that grasps, operates and moves the door. Several alternate paths for the path to ground include the following:

1) From the robotic arm operating the door, for example, key receiving portions of said arm, through conductive components in the door such as the latching mechanism, to a conductive wafer restraint that is mounted on the door for engaging the wafers.

2) From the machine interface upon which the carrier sits, to a conductive door contactor portion that contacts a portion of the door when the door is moved into position on the carrier, to the conductive wafer restraints on the door.

3) From the machine interface upon which the carrier sits, to a moveable conductive active wafer restraint attached within the enclosure portion, to the wafers.

4) From the robotic arm operating the door, for example, the key insert portions of said arm, through conductive components in the door such as the latching mechanism, to a conductive contactor portion extending from the door to an active wafer restraint mounted within the enclosure portion. The active wafer restraint may be actuated by a fixed conductive contactor portion or by an active contactor portion operated by the latching mechanism of the door.

The conductive components may be formed, for example, from carbon fiber or powder filled polymers, metallic composites, conductive film coated ceramics, or conductive film insert molded polymer components.

An object and advantage of preferred embodiments of the invention is that a path to ground for the wafers is established through the door.

An object and advantage of preferred embodiments of the invention is that a path to ground for the door may be established before the wafers come into contact with the wafer restraints thereby minimizing the chance of a potential between the door and wafer causing a static discharge.

An object and advantage of preferred embodiments of the invention is that potential between the door and wafers is eliminated before the cushions mounted on the door come into contact with the wafers.

An object and advantage of preferred embodiments of the invention is that alternative or additional paths to ground are provided. The conventional path to ground circuit is from the wafers through the column of wafer support shelves to the lower machine interface which is grounded through contact with grounded equipment or support base. The alternative circuits are as described above. These may be in lieu of or supplemental to the conventional path and further provide the elimination of potential with the wafer contacting components of the door.

DETAILED DESCRIPTION OF PREFERRED EMBODIMENTS

Figure 1:
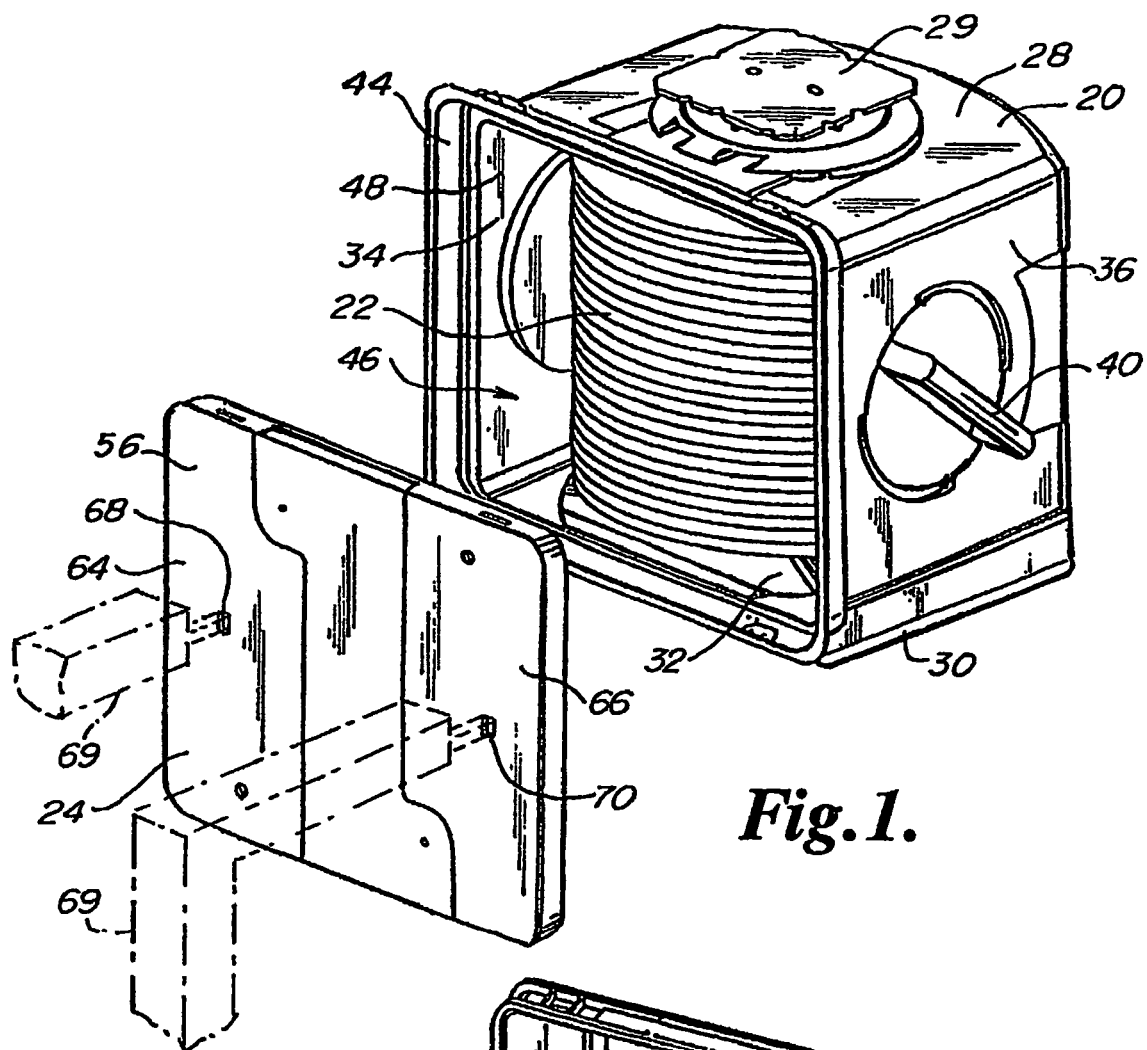
FIG. 1 is a perspective view of a front opening wafer container carrier in accordance with the invention herein.
Figure 2:
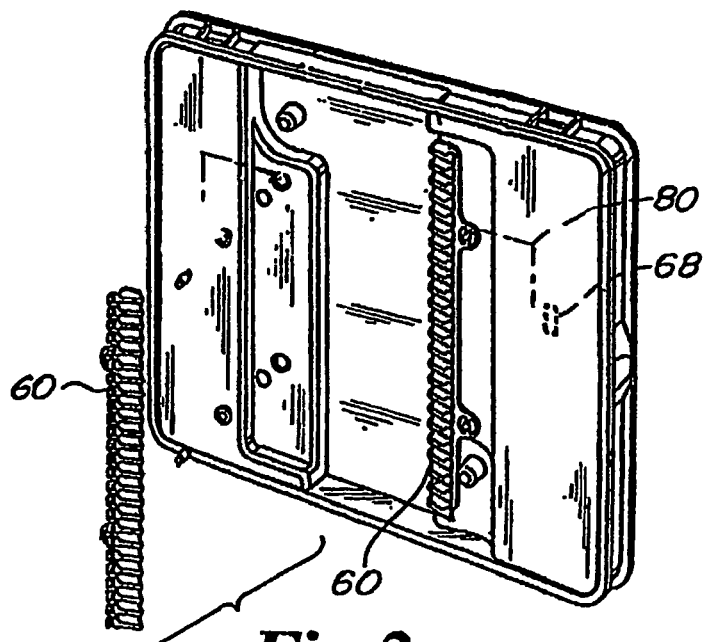
FIG. 2 is a perspective view of a door of a wafer carrier in accordance with the invention herein.

Referring to FIGS. 1, and 2, a wafer carrier according to the invention is illustrated and is principally comprised of an enclosure portion 20 for holding wafers 22 and a door 24. The enclosure portion has a top 28 with a robotic lifting flange 29, a bottom 30 with a machine interface piece 32, a pair of sides 34, 36, side handles 40, a door frame 44, an open front 46, and a open interior 48. The door has an outside surface 56, and inside surface 58, wafer restraints 60, latch compartments 64, 66, and key slots 68, 70. Robotic arms 69 with keys for engaging the door are illustrated with dashed lines. The wafer restraints when mounted on the door may be passive, that is, fixed on the door, or active, as illustrated in U.S. Pat. No. 5,711,427, which is incorporated herein by reference.

Figure 3:
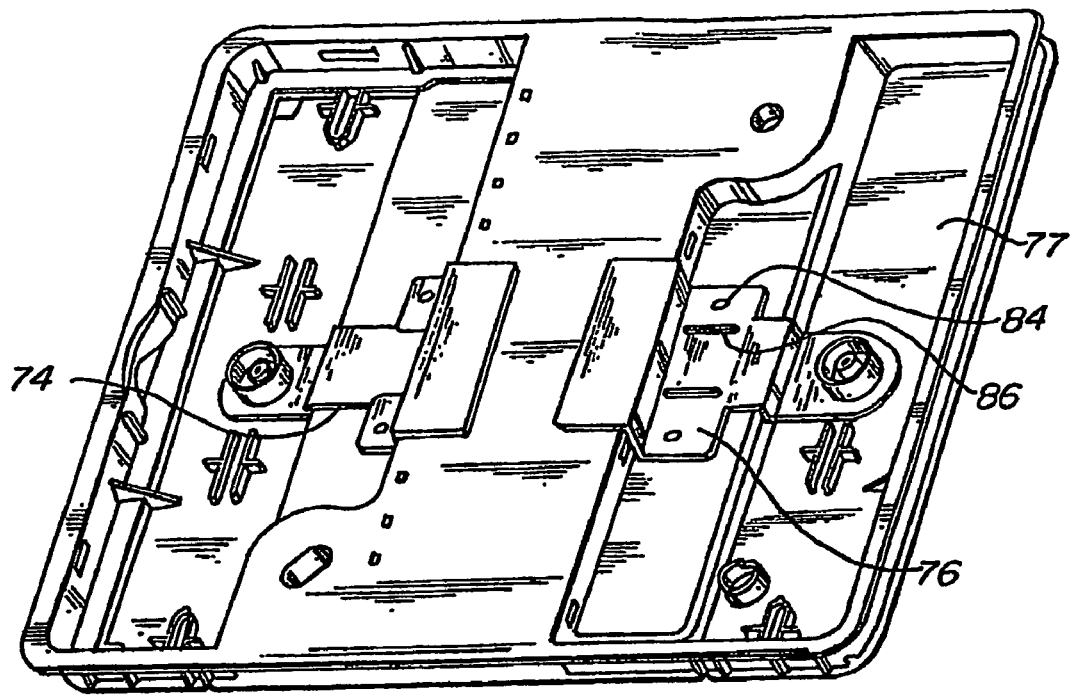
FIG. 3 is a perspective view of a door housing with latch mechanism compartments exposed illustrating insert molded components providing a path to ground.
Figure 4:
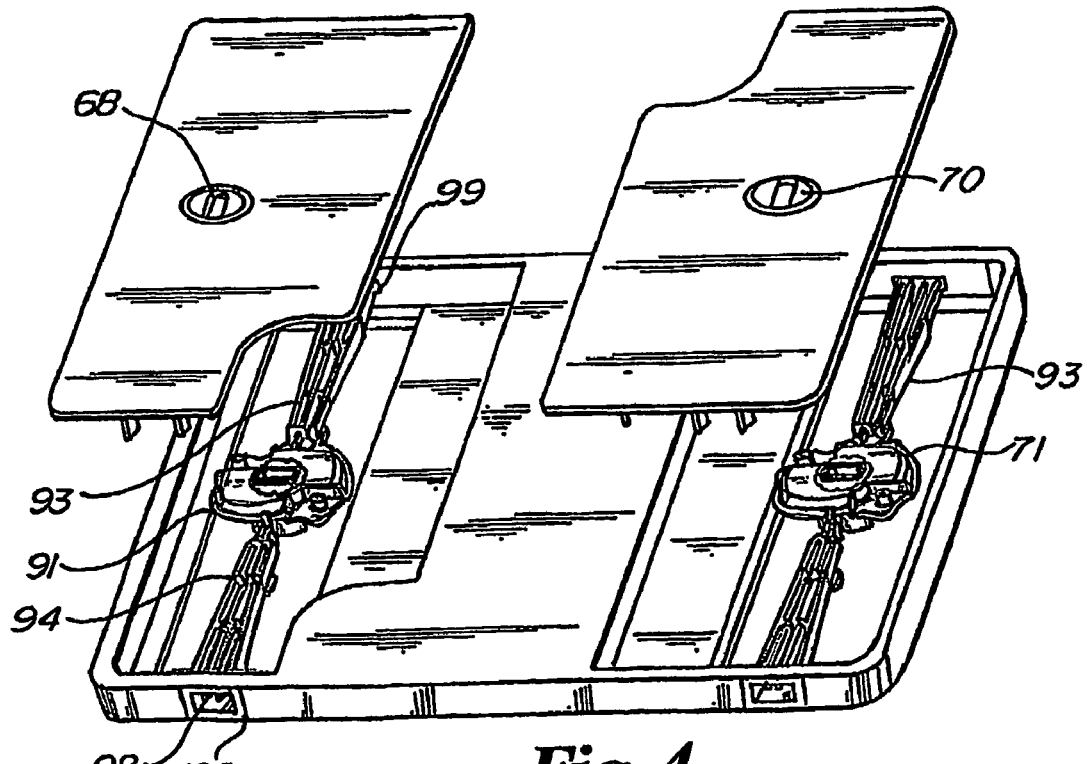
FIG. 4 is an exploded view of an enclosure portion of a wafer carrier with latch mechanism exposed in accordance with the invention herein.
Figure 5:
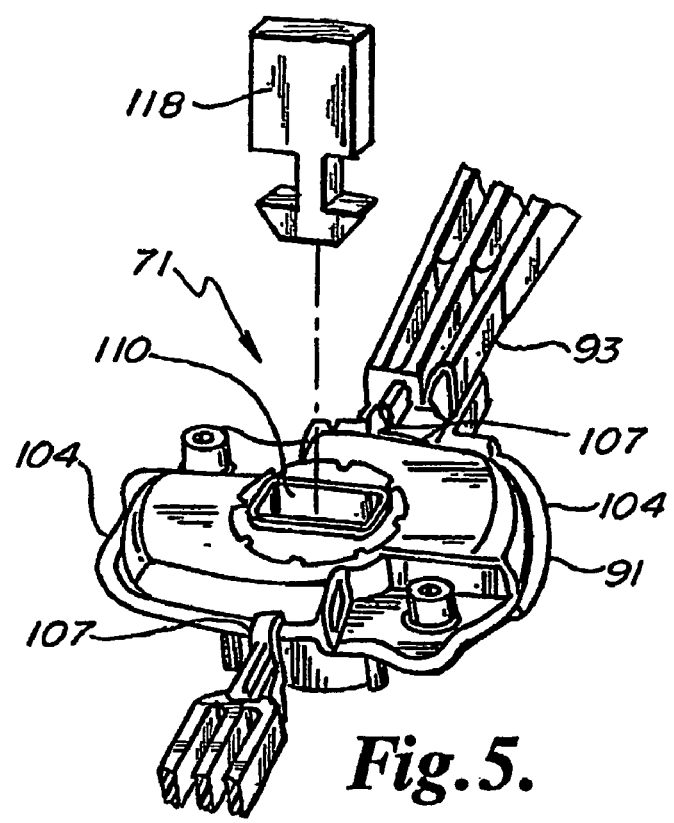
FIG. 5 is a perspective view of a components of a latching mechanism and key suitable for the doors illustrated herein.

As illustrated in FIGS. 3, 4, and 5, a path-to-ground from the wafers may be effectuated through the door latching mechanism 71 and wafer restraints. When used herein, "conductive and static dissipative polymers" mean polymers with surface resistivity of less than about square and preferably less than $10^8$ ohms per square. The specific surface resistivity appropriate may vary depending on the component and path to ground circuit. Conductive plastic pieces 74, 76 may be insert molded into the door housing 77 to provide a conductive path from the mechanism to the mounting receptacles 84 for the wafer restraints. The wafer restraints are formed of conductive material, preferably a carbon filled polymer such as PEEK The insert molding of the conductive plastic pieces 74, 76 may be accomplished by insert molding of rigid pieces such as illustrated in U.S. patent application Ser. No. 09/317, 989, filed May 25, 1999, and owned by the owner of this invention. Said application is hereby incorporated by reference. Also insert molded plastic conductive film may be utilized on components of the door to create the path to ground 80 illustrated by the dashed lines. See U.S. Provisional Patent Application 60//333,686, filed Nov. 27, 2001, and entitled Polymer Film Insert Molding for Providing Electrostatic Dissipation, owned by the owner of this invention and incorporated herein by reference. The door latching mechanism 71 has a cammed hub 91 and a pair of link arms 93, 95 that have latching portions 98, 99 that extend out apertures 100 in the door housing. The cammed hub will typically be molded of plastic with carbon filler to provide static dissipative characteristics and has a pair of cam surfaces 104 that are engaged by a cam followers 107 on the cammed hub. The cammed hub 91 also has a key hole 110 for receiving the key 112 which would, pursuant to this embodiment of the invention, be grounded and part of a robotic operating arm. Thus, in this embodiment, the grounded key 112 is inserted into the key hole 110 and makes contact with the conductive cammed hub. The cammed hub rotates on and contacts protrusion 113 as part of the conductive piece of the door housing. The conductive wafer retainers either may directly contact the conductive piece of the door housing or a conductive mounting receptacle 84. When the door is placed on the enclosure portion by the robotic arm, the latching mechanism is grounded by the key and when the wafer restraints contact the wafers they a path-to-ground is provided. In an alternative embodiment the door housing may be made of conductive plastic eliminating the conductive piece.

Figure 6:
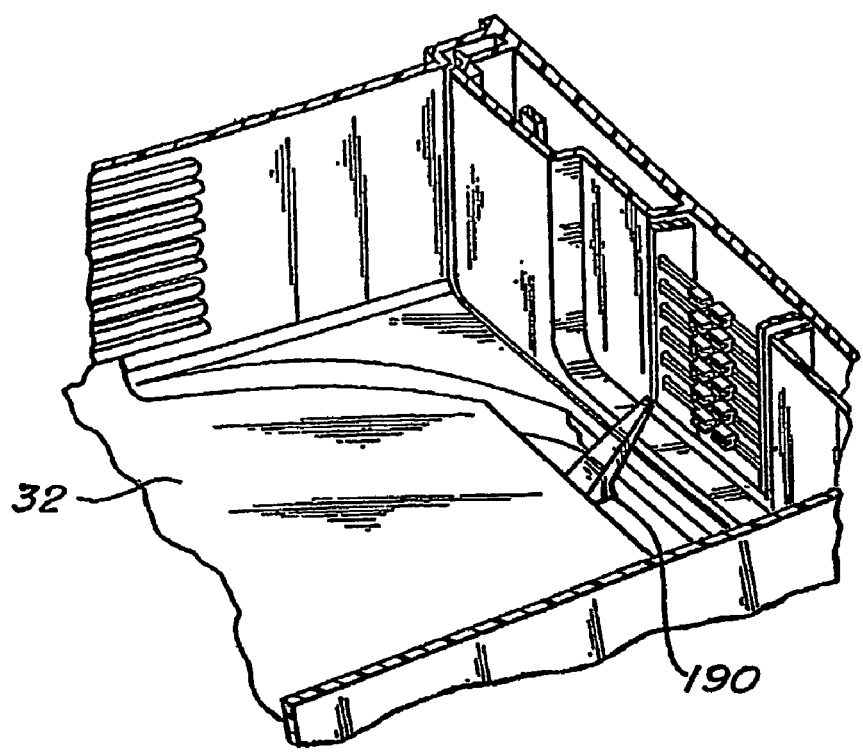
FIG. 6 is a perspective view of an enclosure portion and door of a wafer carrier with portions cut away illustrating an embodiment of the invention herein.

Referring to FIG. 6, an alternative means of providing a path-to-ground effectuated by the door is illustrated. In this embodiment, the machine interface piece 32, is formed of conductive plastic and has three slots, not shown in this embodiment, forming a kinematic coupling in said piece. A conductive door contacting piece 190, configured as an arm, extends from the interface piece and is appropriately positioned to contact the door when the door is closed onto the enclosure portion. In a preferred embodiment, the arm may directly contact the wafer restraint, which will also be formed of conductive plastic. In a related embodiment a conductive plastic arm may extend from the door, be conductively connected to wafer restraints, and contact the grounded machine interface piece as the door is closing. The arm in these embodiments may be angled and have a thinned elongate portion to facilitate bending during and after engagement with the respective components. Other embodiments may have curved compressible spring sections. Thus, in this embodiment, the path-to-ground conductive circuit is effectuated from the machine interface which is grounded on the equipment or fixture upon which the container is placed. The path-to-ground circuit extends from the machine interface to the door through a container-door bridging component configured as an arm, and then to the wafer restraints. Preferably the container-door bridging component makes the connection between the door and the enclosure portion before the wafer restraints contact the wafers.

Figure 8:
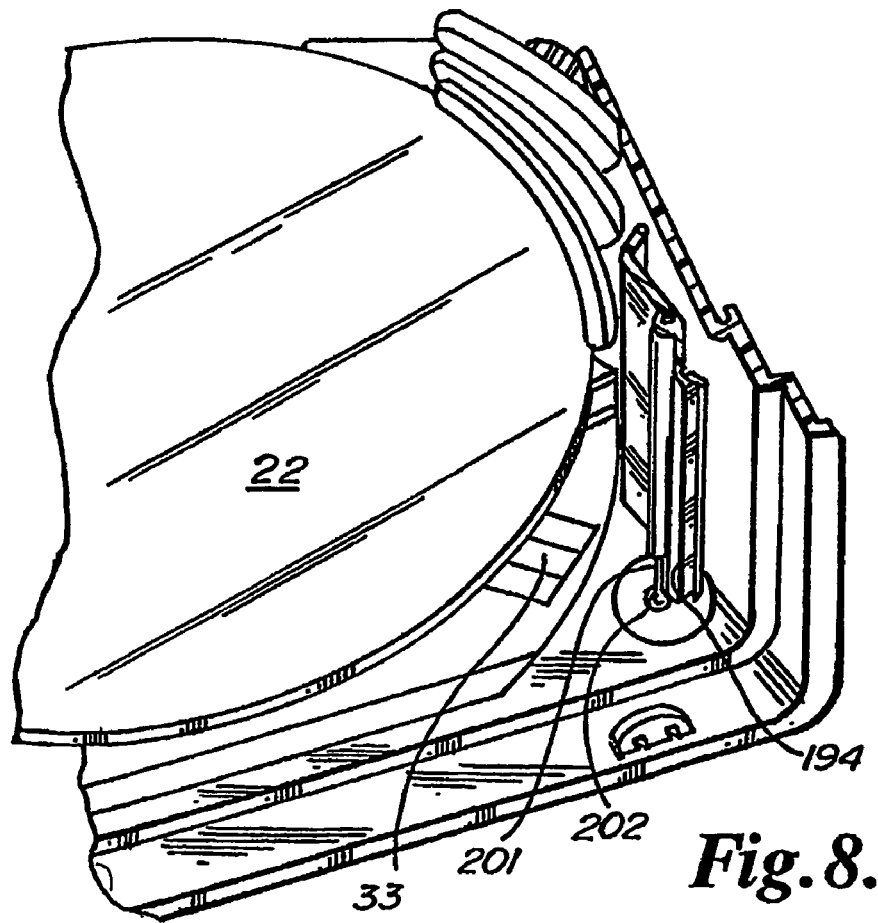
FIG. 8 is a perspective view with sections cut-away of an enclosure portion of the wafer carrier of FIG. 7 in accordance with the invention herein.
Figure 7:
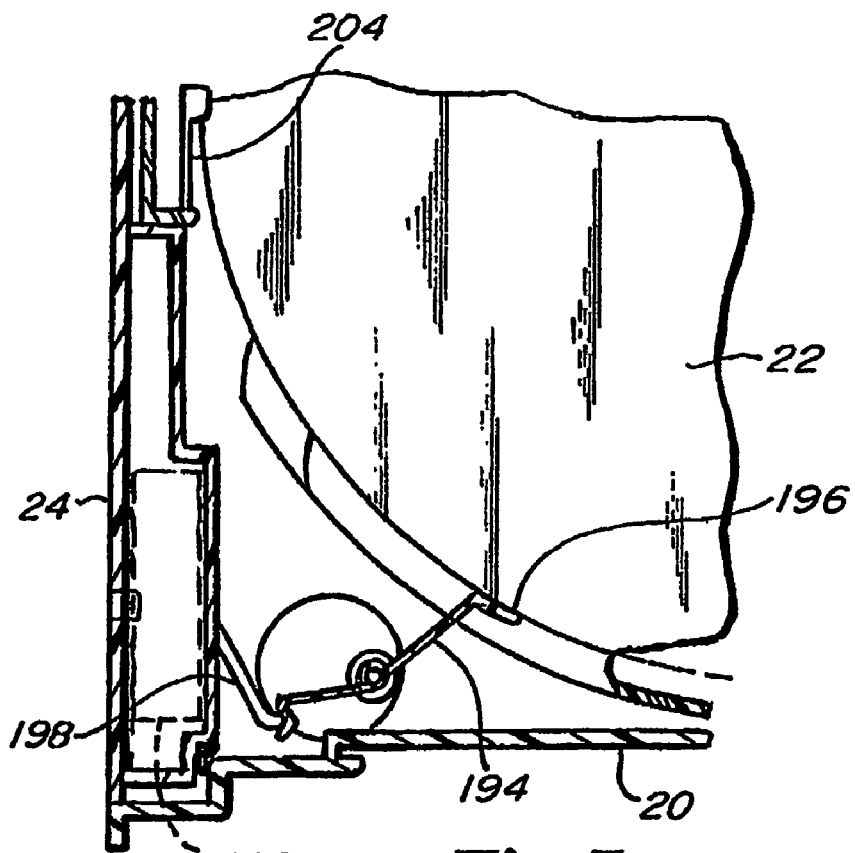
FIG. 7 is a plan cross-sectional view of a portion of a wafer carrier illustrating a further embodiment of the invention.

Referring to FIGS. 7 and 8, an alternative embodiment of the invention is illustrated. In this embodiment the enclosure portion has a movable wafer restraint mechanism pivotally attached to the enclosure portion and configured as a pivotal elongate wafer contacting member 194. The wafer contacting member or wafer restraint pivots to bring a wafer engaging portion 96 into restraining and conductive contact with the wafers as illustrated in FIG. 8. The pivoting action of the wafer restraint is effected by an actuation member 198 extending from the door and the conductive elongate wafer contacting member rotates about a conductive pin 201 engaged in apertures 202 on appropriate grounded support portions on the bottom of the wafer enclosure portion. A similar pin receiving aperture may be on the top of the wafer enclosure. Depending on the configuration of the wafer restraint, the actuation member can be passive, to actuate the wafer restraint by simply closing the door, or can be active to operate by actuation of the latching mechanism 199. When the door is moved into the closure position, the door actuation member 198 engages with the actuation member to move same into an contact and restraining position with the stack of wafers. In this embodiment, the further door wafer restraints 204 may or may not be utilized. If utilized, the door wafer restraints may be grounded by way of actuation member engaging the grounded elongate wafer contacting member.

Thus the invention functions as follows: when the enclosure portion has a wafer stack or wafer positioned therein, the door is moved into place, either manually or by robotic means. In the preferred embodiment, the wafer restraints are grounded by completion of a path to ground before the wafer restraints come into contact with the wafers.

The present invention may be embodied in other specific forms without departing from the spirit or essential attributes thereof, and it is, therefore, desired that the present embodiment be considered in all respects as illustrative and not restrictive

We claim:

1. A wafer container comprising an enclosure portion with an open front, a door for sealingly closing the open front, the enclosure portion comprising a plurality of shelves for holding a vertical stack of spaced horizontal wafers, the door having a door housing, a wafer restraint formed of conductive plastic with a plurality of wafer engagement members positioned on the door housing, said plurality of wafer engagement members adapted to engage said stack of spaced horizontal wafers when said door is positioned so as to sealingly close the open front of said enclosure portion, and a latching mechanism contained within the door housing, the latching mechanism having a key receiving portion on a front side of the door with a key receiving slot, the door housing and latching mechanism having conductive portions electrically conductively connecting said wafer restraint with said key receiving portion so that when a grounded key is inserted into the key slot to engage the key receiving portion, the wafer restraint is grounded though said conductive portions.

2. The wafer container of claim 1 wherein the door housing is formed of nonconductive plastic.

3. The wafer container of claim 2 wherein a conductive piece is positioned in the door housing by way of insert molding and wherein the path to ground extends through said conductive piece.

4. A wafer container comprising an enclosure portion with an open front, a door moveable from a closed position whereby the door is sealingly closing the open front, to an open position whereby the door is separated from the enclosure portion, the enclosure portion comprising a plurality of shelves for holding a vertical stack of spaced horizontal wafers, a wafer retainer made from electrically conductive material and adapted to contact said wafers, and a groundable machine interface on a lower side of the enclosure portion, the wafer container further comprising an electrically conductive connection portion bridging between the door and the enclosure portion when the door is in the closed position, the connection portion forming part of a conductive path to ground circuit between the wafer retainer and the groundable machine interface when the door is in the closed position.

5. The wafer container of claim 4, wherein the conductive connection portion comprises an arm extending from one of the door and enclosure portion to the other of the door and enclosure portion when the door is in the closed position.

6. The wafer container of claim 5, wherein the arm extends from the door and is operatively connected to the latch mechanism.

7. The wafer container of claim 5 wherein the conductive connector is fixed to the door and the enclosure portion further comprises a pivotal wafer restraint actuated by said conductive connector when the door is moved into the closed position.

8. The wafer container of claim 7 wherein the pivotal wafer restraint is moveable between an obstructing position and a nonobstructing position with respect to insertion and removal of wafers from the plurality of shelves.

9. A wafer container comprising an enclosure portion with an open front, a door moveable from an open position whereby the door is separated from the enclosure portion to a closed position whereby the door is sealingly closing the open front, the enclosure portion comprising a plurality of shelves for holding a vertical stack of spaced horizontal wafers, the wafer container including a path to ground circuit extending through conductive plastic components and the path to ground circuit is open when the door is in the open position and wherein the closing of the door effectuates the closing of the path to ground circuit.

10. The wafer container of claim 9 wherein the path to ground circuit extends through a latching mechanism contained in the door.

11. A wafer container comprising an enclosure portion with an open front, a door moveable from a closed position whereby the door is sealingly closing the open front, to an open position whereby the door is separated from the enclosure portion, the enclosure portion comprising a plurality of shelves for holding a vertical stack of spaced horizontal wafers and a groundable machine interface on a lower side of the enclosure portion, the door including a plurality of electrically conductive wafer restraints adapted to engage the wafers when the door is in the closed position, the wafer container further comprising an electrically conductive connection portion bridging between the door and the enclosure portion when the door is in the closed position, the connection portion forming part of a conductive path to ground circuit between the wafer retainers and the groundable machine interface when the door is in the closed position.

12. The wafer container of claim 11 connection portion comprises an arm extending from one of the door and enclosure portion to the other of the door and enclosure portion when the door is in the closed position.

13. The combination of a wafer and a container for holding the wafer, wherein the container comprises:
an enclosure portion having a top, a bottom, a pair of opposing sides, a back and an opposing open front defined by a door frame;
a door sealingly engageable in the door frame to close the open front; and
at least one movable wafer restraint, the movable wafer restraint being selectively shiftable with the door between a first position wherein the movable wafer restraint is positioned to enable the wafer to be inserted and removed from the container, and a second position wherein, when the wafer is received in the enclosure, the movable wafer restraint is engaged with and restrains the wafer, wherein the movable wafer restraint comprises an elongate wafer contacting member pivotally coupled with the enclosure portion at a pivot, and wherein the elongate wafer contacting member includes a first end comprising a door contacting portion and a second opposing end comprising a wafer engaging portion.

14. The combination of claim 13, wherein the movable wafer restraint is selectively shiftable from the first position to the second position with an actuation member extending from the door.

15. The combination of claim 14, wherein the actuation member selectively shifts the movable wafer restraint from the first position to the second position by closing the door.

16. The combination of claim 14, wherein the actuation member selectively shifts the movable wafer restraint from the first position to the second position when a latching mechanism on the door is actuated.

17. A wafer container comprising:
an enclosure having a top, a bottom, a pair of opposing sides, a back, and an opposing open front defined by a door frame;
a wafer restraint attached to said enclosure selectively pivotable between a first position enabling a wafer to be inserted and removed from said enclosure and a second position wherein, when the wafer is in said enclosure, said wafer restraint is operably engaged with and restrains the wafer from moving toward the front; and
a door engageable in said door frame, said door effectuating movement of said wafer restraint from said first position to said second position when said door is engaged in said door frame.

* * * * *